United States Patent
Jeong

(10) Patent No.: US 9,779,867 B2
(45) Date of Patent: Oct. 3, 2017

(54) ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventor: Dong Jin Jeong, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/936,471

(22) Filed: Nov. 9, 2015

(65) Prior Publication Data

US 2016/0141093 A1 May 19, 2016

(30) Foreign Application Priority Data

Nov. 19, 2014 (KR) .......................... 10-2014-0161665

(51) Int. Cl.
*H01F 27/29* (2006.01)
*H01F 5/00* (2006.01)
(Continued)

(52) U.S. Cl.
CPC ......... *H01F 17/0013* (2013.01); *H01F 17/04* (2013.01); *H01F 27/292* (2013.01);
(Continued)

(58) Field of Classification Search
CPC ............... H01F 27/2804; H01F 27/292; H01F 2027/2809; H01F 17/0013; H01F 17/04;
H01F 2017/048; H05K 1/0313; H05K 1/181; H05K 1/111; H05K 2201/10636;
H05K 3/3442; H05K 2201/003
(Continued)

(56) References Cited

U.S. PATENT DOCUMENTS

| 6,218,925 B1* | 4/2001 | Iwao | H01F 17/0013 336/200 |
| 2011/0193671 A1* | 8/2011 | Iwasaki | H01F 17/0013 336/200 |

(Continued)

FOREIGN PATENT DOCUMENTS

| JP | 2005-317725 A | 11/2005 |
| JP | 2006-278479 A | 10/2006 |

(Continued)

OTHER PUBLICATIONS

Korean Office dated Sep. 9, 2015, issued in corresponding Korean Patent Application No. 10-2014-0161665. (w/ English translation).

*Primary Examiner* — Mangtin Lian
(74) *Attorney, Agent, or Firm* — McDermott Will & Emery LLP

(57) ABSTRACT

An electronic component includes a body including internal electrodes; an insulating layer disposed on side surfaces of the body and at least one of an upper surface of the body and a lower surface of the body; and an external electrode disposed on an end surface of the body and connected to the internal electrodes. The external electrode extends to at least one of the upper surface of the body, the lower surface of the body, and the side surfaces of the body, and partially overlaps the insulating layer.

15 Claims, 3 Drawing Sheets

(51) Int. Cl.
  *H01F 27/24* (2006.01)
  *H01F 17/00* (2006.01)
  *H01F 17/04* (2006.01)
  *H05K 3/34* (2006.01)

(52) U.S. Cl.
  CPC ...... *H01F 2017/048* (2013.01); *H05K 3/3442* (2013.01); *H05K 2201/1003* (2013.01); *H05K 2201/10636* (2013.01); *Y02P 70/611* (2015.11)

(58) Field of Classification Search
  USPC .......... 336/200, 192, 233; 361/301.4, 306.3, 361/313, 321.1, 321.2, 307, 308.1, 303
  See application file for complete search history.

(56) References Cited

U.S. PATENT DOCUMENTS

| | | | |
|---|---|---|---|
| 2012/0274432 A1* | 11/2012 | Jeong | H01F 27/2804 336/192 |
| 2013/0050899 A1 | 2/2013 | Kim et al. | |
| 2013/0154058 A1* | 6/2013 | Boday | H01C 1/14 257/536 |
| 2013/0222101 A1 | 8/2013 | Ito et al. | |
| 2013/0249664 A1* | 9/2013 | Tonoyama | H01F 41/04 336/200 |
| 2015/0325369 A1* | 11/2015 | Inoue | H01C 17/02 336/200 |

FOREIGN PATENT DOCUMENTS

| | | |
|---|---|---|
| KR | 10-2012-0122589 A | 11/2012 |
| KR | 10-2013-0022824 A | 3/2013 |
| KR | 10-2013-0049207 A | 5/2013 |
| KR | 10-2014-0063032 A | 5/2014 |

\* cited by examiner

ELECTRONIC COMPONENT AND BOARD HAVING THE SAME

CROSS-REFERENCE TO RELATED APPLICATION

This application claims the benefit of priority to Korean Patent Application No. 10-2014-0161665 filed on Nov. 19, 2014 with the Korean Intellectual Property Office, the entirety of which is incorporated herein by reference.

BACKGROUND

The present disclosure relates to an electronic component and a board having the same.

An inductor, an electronic component, is a representative passive element constituting, together with a resistor and a capacitor, an electronic circuit to remove noise.

The electronic component may be mounted on a printed circuit board (PCB) by soldering to thereby be electrically connected to a circuit of the printed circuit board.

Due to characteristics of the electronic component that has been miniaturized and highly integrated, an inductor is required to be mounted on a small space. In this case, there is a risk of a short circuit being generated between the body of the inductor and external electrodes of the inductor, or the like. In order to solve this problem, a method of forming an insulating layer on the body of the inductor has been investigated. However, an area in which the external electrodes and the body of the inductor are bonded to each other is decreased due to the insulating layer formed on the body of the inductor, and thus, bonding strength between the external electrodes and the body of the inductor is decreased.

SUMMARY

An exemplary embodiment in the present disclosure may provide an electronic component in which mounting stability is improved and bonding strength between external electrodes and a body is improved by forming the external electrodes to overlap an insulating layer, and a board having the same.

According to an exemplary embodiment in the present disclosure, an electronic component comprises a body including internal electrodes; an insulating layer disposed on side surfaces of the body and at least one of an upper surface of the body and a lower surface of the body; and an external electrode disposed on an end surface of the body and connected to the internal electrodes, wherein the external electrode extends to at least one of the upper surface of the body, the lower surface of the body, and the side surfaces of the body, and partially overlaps the insulating layer.

In one embodiment, A/B may satisfy $0.01 \leq A/B \leq 0.15$, where A is a length of a portion of an extended portion of the external electrode that overlaps the insulating layer and B is a length of a portion of the extended portion of the external electrode that does not overlap the insulating layer.

The portion of the extended portion of the external electrode that overlaps the insulating layer may cover the insulating layer.

The external electrode may extend to only the lower surface of the body.

The internal electrodes may form a coil having a spiral shape.

The body may contain a magnetic metal powder and a thermosetting resin.

According to another exemplary embodiment in the present disclosure, an electronic board having an electronic component may comprise a printed circuit board on which first and second electrode pads are disposed; and the electronic component mounted on the printed circuit board, wherein the electronic component includes a body including internal electrodes; an insulating layer disposed on side surfaces of the body and at least one of an upper surface of the body and a lower surface of the body; and an external electrode disposed on an end surface of the body and connected to the internal electrodes, wherein the external electrode extends to at least one of the upper surface of the body, the lower surface of the body, and the side surfaces of the body, and partially overlaps the insulating layer.

BRIEF DESCRIPTION OF THE DRAWINGS

The above and other aspects, features and advantages of the present disclosure will be more clearly understood from the following detailed description taken in conjunction with the accompanying drawings.

DETAILED DESCRIPTION

Figure 1:
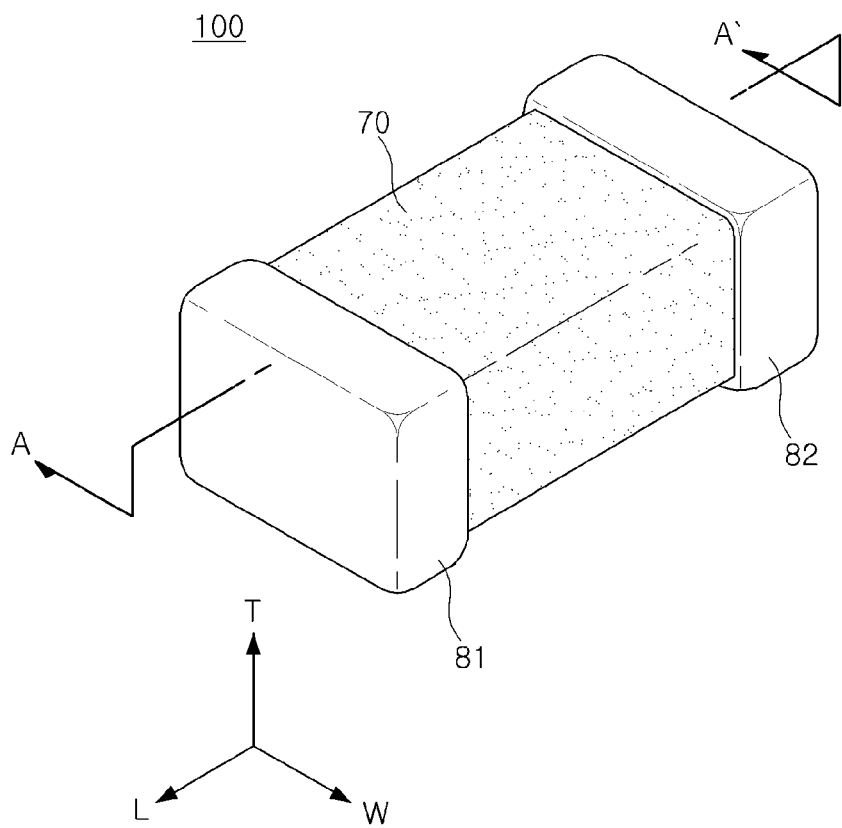
FIG. 1 is a perspective view of an electronic component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Electronic Component

Hereinafter, an electronic component, according to an exemplary embodiment, in particular, a thin-film type inductor, will be described. However, the electronic component according to an exemplary embodiment is not necessarily limited thereto.

Figure 2:
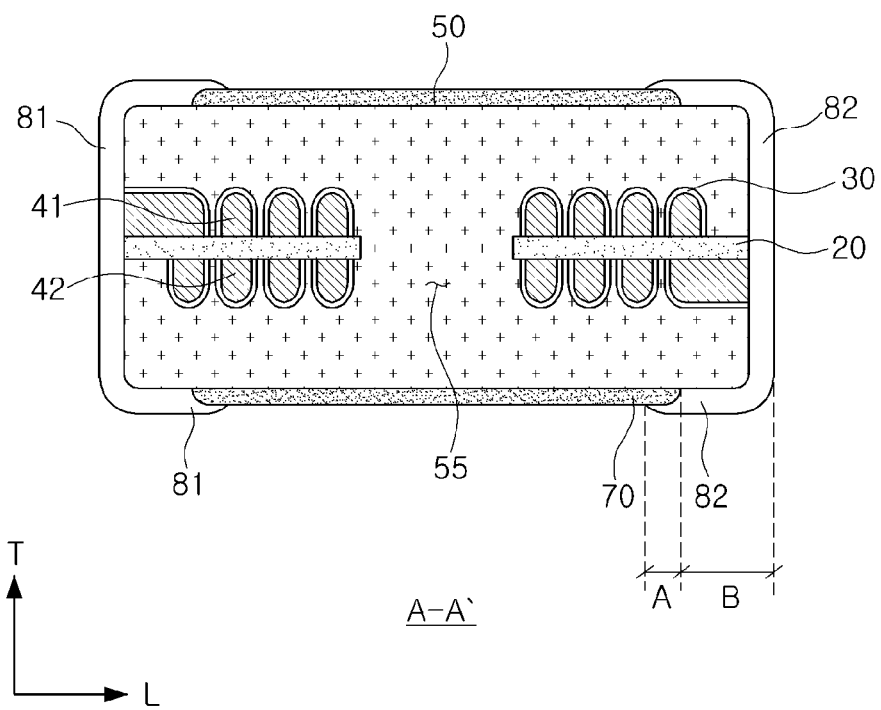
FIG. 2 is a cross-sectional view of the electronic component taken along line A-A' of FIG. 1.

FIG. 1 is a perspective view of an electronic component, according to an exemplary embodiment; and FIG. 2 is a cross-sectional view of the electronic component taken along line A-A' of FIG. 1.

Referring to FIGS. 1 and 2, the electronic component 100, according to an exemplary embodiment, may include a body 50 including internal electrodes 41 and 42, an insulating layer 70 disposed on at least one of upper and lower surfaces of the body 50 and side surfaces of the body 50 in a width direction, and external electrodes 81 and 82 disposed on end surfaces of the body 50 in a length direction and connected to the internal electrodes 41 and 42. Here, the external electrodes 81 and 82 may be extended to at least one of the upper and lower surfaces of the body 50 and the side surfaces of the body 50 in the width direction to thereby overlap the insulating layer 70.

In the electronic component 100, according to an exemplary embodiment, the insulating layer 70 may be formed on the body 50, thereby preventing short circuits due to other external electrodes, or the like, when the electronic component 100 is mounted. In addition, the insulating layer 70 is not disposed on the end surfaces of the body 50 through which the internal electrodes 41 and 42 are externally exposed from the body 50, and may be disposed on the upper or lower surface of the body 50 or the side surfaces of the body 50 to partially overlap the external electrodes 81 and 82, whereby bonding strength between the external electrodes 81 and 82 and the body 50 may be improved, and electrical connectivity between the external electrodes 81 and 82 and the internal electrodes 41 and 42 may also be improved.

In the electronic component 100, according to an exemplary embodiment, a 'length' direction refers to an 'L' direction of FIG. 1, a 'width' direction refers to a 'W' direction of FIG. 1, and a 'thickness' direction refers to a 'T' direction of FIG. 1.

Referring to FIGS. 1 and 2, the internal electrodes 41 and 42 may be exposed to the end surfaces of the body 50 in the length direction and the insulating layer 70 may be formed on surfaces of the body 50 other than the end surfaces of the body 50 in the length direction. The external electrodes 81 and 82 may be connected to the internal electrodes 41 and 42 on the end surfaces of the body 10 in the length direction and be extended to the upper and lower surfaces of the body 50 and the side surfaces of the body 50 in the width direction.

The body 50 may form the exterior appearance of the electronic inductor 100 and may be formed of any material that has magnetic properties. For example, the body 50 may be formed by filling the interior of the body with ferrite or magnetic metal powder.

The ferrite may be, for example, an Mn—Zn based ferrite, an Ni—Zn based ferrite, an Ni—Zn—Cu based ferrite, an Mn—Mg based ferrite, a Ba based ferrite, an Li based ferrite, or the like.

The magnetic metal powder may contain one or more selected from the group consisting of Fe, Si, Cr, Al, and Ni. For example, the magnetic metal powder may be an Fe—Si—B—Cr based amorphous metal, but is not necessarily limited thereto.

The magnetic metal powder may have a particle size of 0.1 μm to 3 μm and may be contained in a thermosetting resin such as an epoxy resin, polyimide, or the like, in a form in which it is dispersed in the thermosetting resin.

The internal electrodes 41 and 42 disposed in the body 50 may form a spiral-shaped coil.

A first internal electrode 41 having a coil shape may be formed on one surface of a substrate 20 disposed in the body 50, and a second internal electrode 42 having a coil shape may be formed on the other surface of the substrate 20 opposing one surface of the substrate 20. The first and second internal electrodes 41 and 42 may be electrically connected to each other through a via (not illustrated) in the substrate 20.

The first and second internal electrodes 41 and 42 may be formed by electroplating.

The internal electrodes 41 and 42 and the via (not illustrated) may be formed of a metal having excellent electrical conductivity, such as silver (Ag), palladium (Pd), aluminum (Al), nickel (Ni), titanium (Ti), gold (Au), copper (Cu), platinum (Pt), or an alloy thereof.

The internal electrodes 41 and 42 may be coated with an insulating film 30. The insulating film 30 may be formed by a method well-known in the art, such as a screen printing method, an exposure and development method of a photoresist (PR), or a spray applying method.

The insulating film 30 may contain at least one selected from the group consisting of epoxy, polyimide, and liquid crystalline polymer (LCP), but is not limited thereto. The internal electrodes 41 and 42 may be coated with the insulating film 30, such that they may not directly contact the magnetic material forming the body 50.

The substrate 20 may be, for example, a polypropylene glycol (PPG) substrate, a ferrite substrate, a metal based soft magnetic substrate, or the like. The substrate 20 may have a through-hole formed in a central portion thereof to penetrate through the central portion thereof, wherein the through-hole may be filled with a magnetic material to form a core part 55. The core part 55 may be filled with the magnetic material, thereby improving inductance (Ls).

One end portion of the first internal electrode 41 formed on one surface of the substrate 20 may be exposed to one end surface of the body 50 in the length L direction, and one end portion of the second internal electrode 42 formed on the other surface of the substrate 20 may be exposed to the other end surface of the body 50 in the length L direction.

The internal electrodes 41 and 42 exposed to both end surfaces of the body 50 in the length L direction may be electrically connected to the first and second external electrodes 81 and 82, respectively.

The first and second external electrodes 81 and 82 may be formed of a metal having excellent electrical conductivity, such as nickel (Ni), copper (Cu), tin (Sn), silver (Ag), or an alloy thereof.

A material of the insulating layer 70 is not particularly limited, but may be ceramic slurry. A position and height of the insulation layer 70 may be adjusted by adjusting an amount and shape of the ceramic slurry. The insulating layer 70 may be formed by applying the ceramic slurry onto the body 50 after the body 50 is formed. A method of applying the ceramic slurry is not particularly limited. For example, the ceramic slurry may be applied by a spray method or by using a roller. The insulating layer may contain at least one selected from the group consisting of epoxy, heat resistant polymer, glass, and ceramic, but is not particularly limited thereto.

In FIGS. 1 and 2, the insulating layer may be disposed on any one of the upper and lower surfaces of the body 50 and the side surfaces of the body 50 in the width direction, and the external electrodes 81 and 82 may be extended to any one of the upper and lower surfaces of the body 50 and the side surfaces of the body 50 in the width direction.

The external electrodes 81 and 82 may be formed of a metal having excellent electrical conductivity, such as nickel (Ni), copper (Cu), tin (Sn), silver (Ag), or an alloy thereof.

In a case in which the external electrodes 81 and 82 are extended to the upper or lower surface of the body 50, the insulating layer 70 may not be formed in portions of the upper or lower surface of the body 50 spaced apart from both end surfaces of the body 50 in the length direction by a predetermined distance. The external electrodes 81 and 82 may be extended to portions of the upper or lower surface of the body 50 on which the insulating layer 70 is not formed. As described above, the external electrodes 81 and 82 may be extended to the portions of the body 50 on which the insulating layer 70 is not present, thereby improving bonding strength between the external electrodes 81 and 82 and the body 50.

When the external electrodes 81 and 82 are extended to the upper or lower surface of the body 50, as described above, the external electrodes 81 and 82 may partially overlap the insulating layer 70 disposed on the upper or lower surface of the body 50. As described above, the external electrodes 81 and 82 and the insulating layer 70 may overlap each other, such that the upper or lower surface of the body 50 may be stably insulated from other external electrodes, or the like, and bonding strength between the external electrodes 81 and 82 and the body 50 may be improved.

Likewise, when the external electrodes 81 and 82 are extended to both side surfaces of the body 50 in the width direction, the insulating layer 70 may not be formed on portions of both side surfaces of the body 50 spaced apart from both end surfaces of the body 50 in the length direction by a predetermined distance. In addition, the external electrodes 81 and 82 may partially overlap the insulating layer 70 disposed on both side surfaces of the body 50 in the width direction.

When a length of a portion of extended portions of the external electrodes 81 and 82 which overlaps the insulating layer 70 is A and a length of a portion of the extended portions of the external electrodes 81 and 82 which does not overlap the insulating layer 70 is B, $0.01 \leq A/B \leq 0.15$ may be satisfied.

When a value of A/B is larger than 0.15, the length A of the portion of the extended portions of the external electrodes 81 and 82 that overlaps the insulating layer 70 is long and the length B of the portion of extended portions of the external electrodes 81 and 82 that does not overlap the insulating layer 70 is short, such that a bonding area between the external electrodes 81 and 82 and the body 50 is decreased, whereby bonding strength between the external electrodes 81 and 82 and the body 50 may be decreased.

In addition, when a value of A/B is smaller than 0.01, a plating solution may permeate into the body through a fine gap between the external electrodes and the insulating layer when a plating process for forming plating layers is performed on outer surfaces of the external electrodes. When the plating solution permeates into the body, short circuits may be generated between the external and internal electrodes. In addition, short circuits may be generated between the external electrodes and the magnetic material of the body.

Therefore, by satisfying $0.01 \leq A/B \leq 0.15$, the external electrodes 81 and 82 and the body 50 may be stably bonded to each other and permeation of the plating solution may be prevented.

Table 1 shows a relationship between bonding strength between the external electrodes and the body and electrical stability between the external electrodes and the magnetic material or the internal electrodes depending on a relationship between the length A of the portion of the extended portions of the external electrodes 81 and 82 that overlaps the insulating layer 70 and the length B of the portion of the extended portions of the external electrodes 81 and 82 that does not overlap the insulating layer 70.

In Table 1, inductors were formed to include an insulating layer and external electrodes formed on outer surfaces of a body. Inductors according to Inventive Examples were formed to satisfy $0.01 \leq A/B \leq 0.15$, and inductors according to Comparative Examples were formed so that A/B is out of the above numerical range.

The inductors, according to Comparative Examples and Inventive Examples, were manufactured by applying the insulating layer on the body and having different lengths of overlapping portions between the insulating layer and the external electrodes.

Bonding strength between the external electrodes and the body was measured by performing a thermal shock test on the inductors, and then an interface between the body and the external electrode was observed through a scanning electron microscope (SEM). A case in which a phenomenon in which the external electrodes were stripped from the body was observed was determined to be "O", and a case in which the above-mentioned phenomenon was not observed was determined to be "X".

The electrical stability between the external electrodes and the magnetic material or the internal electrodes, was determined by measuring Q values after plating layers were formed on outer surfaces of the inductors on which the external electrodes were formed. When a short circuit was generated between the external electrodes and the internal electrodes or between the external electrodes and the magnetic material of the body due to permeation of a plating solution into the body during the plating process, the Q value was not measured. Therefore, a case in which the Q value was measured was determined to be "O", and a case in which the Q value was not measured was determined to be "X".

TABLE 1

| Sample No. | A (μm) | B (μm) | A/B | Measurement of Bonding Strength between External Electrodes and Body | Electrical Stability between External Electrodes and Magnetic Material or Internal Electrodes |
|---|---|---|---|---|---|
| Comparative Example 1 | 0 | 212 | 0.00 | O | X |
| Comparative Example 2 | 1 | 203 | 0.005 | O | X |
| Inventive Example 1 | 2 | 201 | 0.01 | O | O |
| Inventive Example 2 | 6 | 205 | 0.03 | O | O |
| Inventive Example 3 | 20 | 203 | 0.10 | O | O |
| Inventive Example 4 | 28 | 189 | 0.15 | O | O |
| Comparative Example 3 | 35 | 176 | 0.20 | X | O |

It may be appreciated from Table 1 that, in a case in which A/B was lower than 0.01, the Q value was not measured, such that a short circuit was generated between the external electrodes and the magnetic material or between the external electrodes and the internal electrodes. In addition, it may be appreciated that, in a case in which A/B was greater than 0.15, bonding strength between the external electrodes and the body was insufficient. Therefore, by satisfying $0.01 \leq A/B \leq 0.15$, an electronic component has improved bonding strength between the external electrodes and the body and improved electrical stability.

Figure 3:
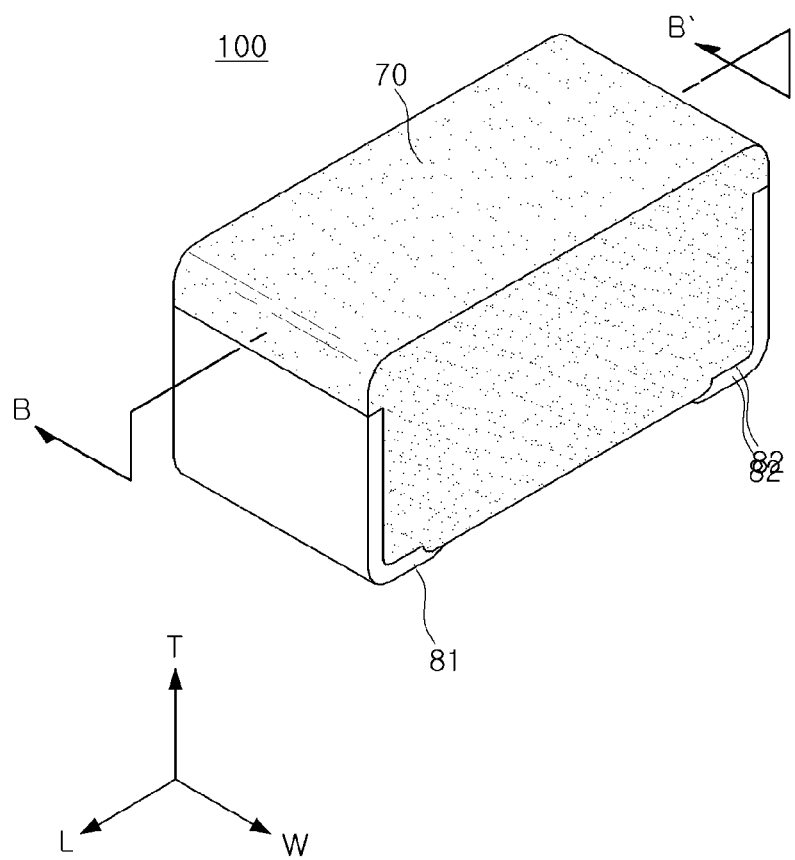
FIG. 3 is a perspective view of an electronic component according to another exemplary embodiment in the present disclosure.
Figure 4:
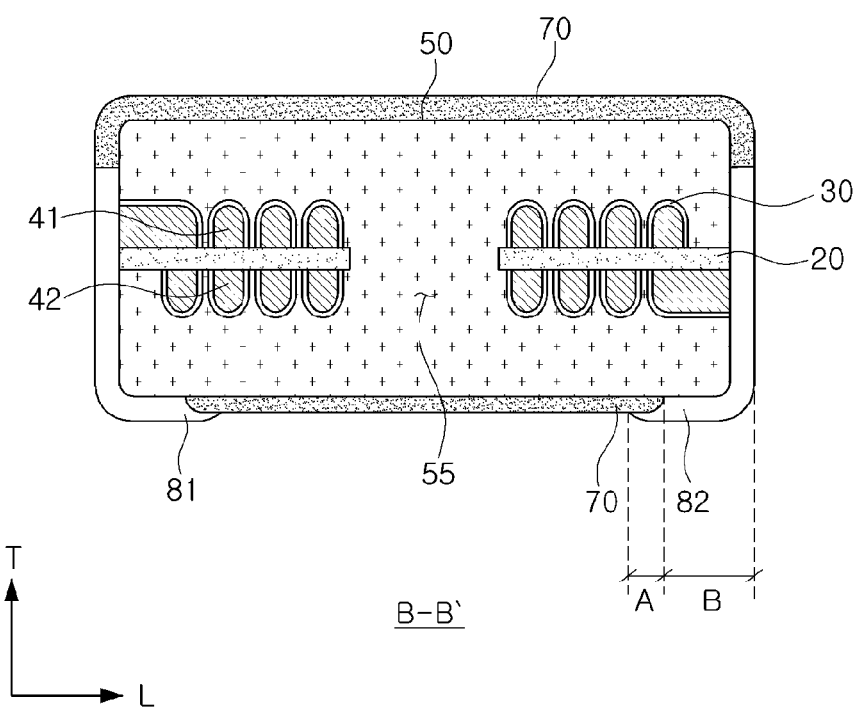
FIG. 4 is a cross-sectional view of the electronic component of FIG. 3 taken along line B-B'.

FIG. 3 is a perspective view of an electronic component according to another exemplary embodiment; and FIG. 4 is a cross-sectional view of the electronic component taken along line B-B' of FIG. 3.

Referring to FIGS. 3 and 4, in the electronic component according to this exemplary embodiment, first and second external electrodes may be extended only to the lower surface of the body.

When the first and second external electrodes are formed as described above, the first and second external electrodes 81 and 82 are not disposed on the upper surface of the electronic component 100 and both side surfaces of the electronic component 100 in the width direction, whereby it may be less likely that short circuits will be generated by external electrodes, or the like, when the electronic component 100 is mounted. Therefore, a size of the body 50 may be increased and the numbers of windings or stacks of the internal electrodes 41 and 42 may be increased, whereby the electronic component 100 may have high inductance.

In other words, the first and second external electrodes are extended only to the lower surface of the body, whereby mounting stability and inductance of the electronic component 100 may be increased.

Referring to FIGS. 3 and 4, the insulating layer 70 may be formed on the lower surface of the body 50 to be spaced apart from both end surfaces of the body 50 in the length direction by a predetermined distance, and the external electrodes 81 and 82 may be extended from the lower surface of the body 50 and partially overlap the insulating layer 70 formed on the lower surface of the body 50.

Here, when a length of a portion of the extended portions of the external electrodes 81 and 82 which overlaps the insulating layer 70 is A and a length of a portion of the extended portions of the external electrodes 81 and 82 which does not overlap the insulating layer 70 is B, $0.01 \leq A/B \leq 0.15$ may be satisfied, as described above.

Board Having Electronic Component

Figure 5:
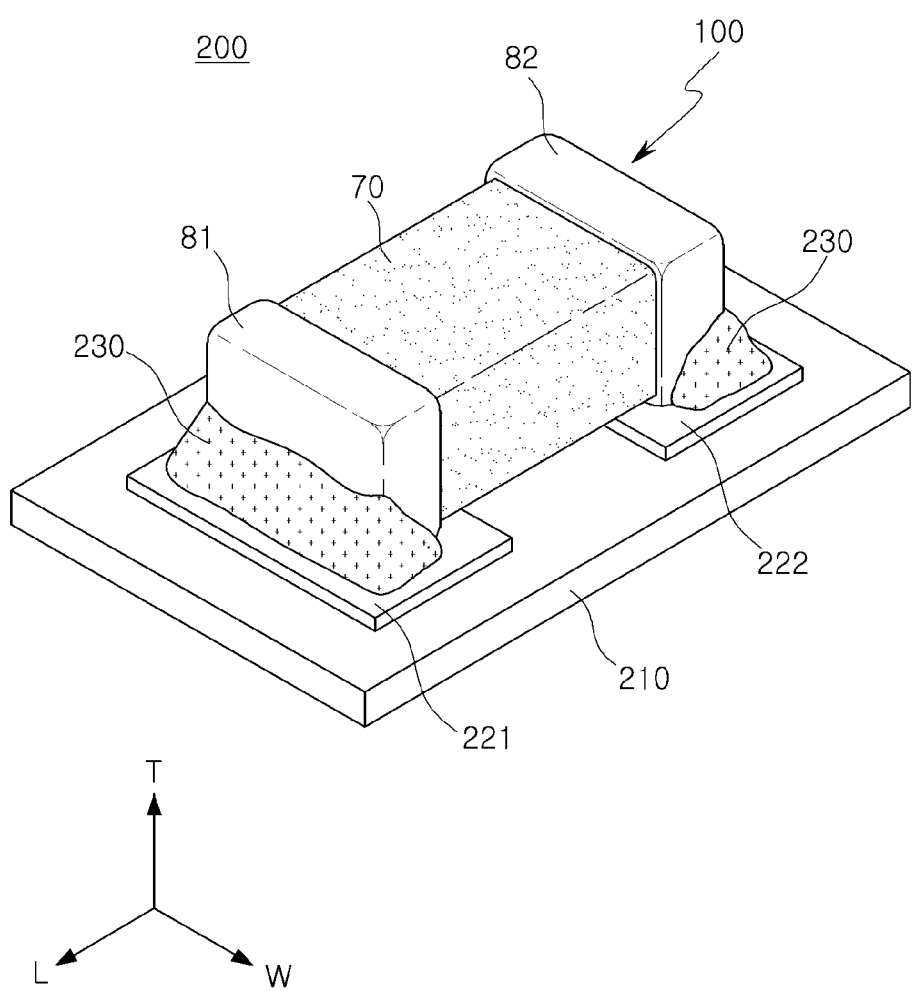
FIG. 5 is a perspective view of a board having an electronic component according to an exemplary embodiment in the present disclosure.

FIG. 5 is a perspective view of a board 200 having an electronic component according to an exemplary embodiment in the present disclosure.

Referring to FIG. 5, the board 200 having an electronic component according to an exemplary embodiment may include a printed circuit board 210 including electrode pads 221 and 222 disposed thereon, and the electronic component mounted on the printed circuit board 210. The electronic component 100 may be the same as the electronic component 100 described above. That is, the electronic component 100 may include a body 50 including internal electrodes 41 and 42, an insulating layer 70 disposed on at least one of upper and lower surfaces of the body 50 and side surfaces of the body 50 in a width direction, and external electrodes 81 and 82 disposed on end surfaces of the body 50 in a length direction and connected to the internal electrodes 41 and 42, wherein the external electrodes 81 and 82 are extended to at least one of the upper and lower surfaces of the body 50 and the side surfaces of the body 50 in the width direction to thereby partially overlap the insulating layer 70.

Here, the electronic component 100 may be soldered by solders 230 to thereby be electrically connected to the printed circuit board 210 in a state in which the first and second external electrodes 81 and 82 formed on both end surfaces of the body are positioned to contact the first and second electrode pads 221 and 222, respectively.

Details of features which overlap those of the electronic component 100 according to the previous exemplary embodiment will be omitted.

As set forth above, according to exemplary embodiments, the external electrodes may be formed to overlap the insulating layer, whereby mounting stability and bonding strength between the external electrodes and the body may be improved.

While exemplary embodiments have been shown and described above, it will be apparent to those skilled in the art that modifications and variations could be made without departing from the scope of the present invention as defined by the appended claims.

What is claimed is:

1. An electronic component comprising:
 a body including internal electrodes;
 an insulating layer disposed on side surfaces of the body and at least one of an upper surface of the body and a lower surface of the body; and
 an external electrode disposed on an end surface of the body and connected to the internal electrodes,
 wherein the external electrode extends to at least one of the upper surface of the body, the lower surface of the body, or the side surfaces of the body, and partially overlaps the insulating layer on a surface of the body other than the end surface,
 wherein A is a length of a portion of an extended portion of the external electrode that overlaps the insulating layer and B is a length of a portion of the extended portion of the external electrode that does not overlap the insulating layer, and
 wherein 2 µm≤A≤28 µm and 189 µm≤B≤201 µm.

2. The electronic component of claim 1, wherein 0.01≤A/B≤0.15.

3. The electronic component of claim 1, wherein the portion of the extended portion of the external electrode that overlaps the insulating layer covers the insulating layer.

4. The electronic component of claim 1, wherein the external electrode extends to only the lower surface of the body.

5. The electronic component of claim 1, wherein the internal electrodes form a coil having a spiral shape.

6. The electronic component of claim 1, wherein the body contains a magnetic metal powder and a thermosetting resin.

7. The electronic component of claim 1, wherein the external electrode partially overlaps a portion of the insulating layer which has a changing thickness.

8. The electronic component of claim 7, wherein the portion of the insulating layer has a thickness which increases in a direction extending away from the external electrode.

9. An apparatus comprising:
 a printed circuit board on which first and second electrode pads are disposed; and
 an electronic component mounted on the printed circuit board,
 wherein the electronic component includes:
 a body including internal electrodes;
 an insulating layer disposed on side surfaces of the body and at least one of an upper surface of the body and a lower surface of the body; and
 an external electrode disposed on an end surface of the body and connected to the internal electrodes,
 wherein the external electrode extends to at least one of the upper surface of the body, the lower surface of the body, or the side surfaces of the body, and partially overlaps the insulating layer on a surface of the body other than the end surface, and
 wherein the external electrode partially overlaps a portion of the insulating layer which has a changing thickness such that said portion is interposed between the external electrode and the body.

10. The board of claim 7, wherein 0.01<A/B<0.15, where A is a length of a portion of an extended portion of the external electrode that overlaps the insulating layer and B is a length of a portion of the extended portion of the external electrode that does not overlap the insulating layer.

11. The board of claim 9, wherein the portion of the extended portion of the external electrode that overlaps the insulating layer covers the insulating layer.

12. The board of claim 9, wherein the external electrode extends to only the lower surface of the body.

13. The board of claim 9, wherein the internal electrodes form a coil having a spiral shape.

14. The board of claim 9, wherein the body contains a magnetic metal power and a thermosetting resin.

15. The electronic component of claim 9, wherein the portion of the insulating layer has a thickness which increases in a direction extending away from the external electrode.

* * * * *